(12) United States Patent
Hagerty

(10) Patent No.: US 8,339,298 B1
(45) Date of Patent: Dec. 25, 2012

(54) SYNCHRONOUS DEMULTIPLEXER CIRCUIT AND METHOD

(75) Inventor: James D. Hagerty, Tiverton, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 330 days.

(21) Appl. No.: 12/868,784

(22) Filed: Aug. 26, 2010

(51) Int. Cl.
*H03M 1/00* (2006.01)

(52) U.S. Cl. .................... 341/141; 341/144; 370/513

(58) Field of Classification Search .............. 341/141, 341/144; 370/513
See application file for complete search history.

(56) References Cited

U.S. PATENT DOCUMENTS

| 4,101,739 | A | * | 7/1978 | Mueller | 370/542 |
| 5,091,907 | A | * | 2/1992 | Wettengel | 370/505 |
| 5,303,241 | A | * | 4/1994 | Takada et al. | 370/513 |
| 5,686,917 | A | * | 11/1997 | Odom et al. | 341/141 |
| 7,463,178 | B2 | * | 12/2008 | Moore | 341/155 |
| 7,778,554 | B2 | * | 8/2010 | Levinson et al. | 398/202 |

* cited by examiner

*Primary Examiner* — Patricia Nguyen
(74) *Attorney, Agent, or Firm* — James M. Kasischke; Jean-Paul A. Nasser; Michael P. Stanley

(57) ABSTRACT

A digital counting circuit with multiple outputs is used to clock interlaced 16-bit data words into separate digital-to-analog converters in the correct sequence for each of eight hydrophone channels. The circuit utilizes a programmable memory to detect a synchronizing bit pattern.

13 Claims, 3 Drawing Sheets

SYNCHRONOUS DEMULTIPLEXER CIRCUIT AND METHOD

STATEMENT OF GOVERNMENT INTEREST

The invention described herein may be manufactured and used by or for the Government of the United States of America for governmental purposes without the payment of any royalties thereon or therefore.

CROSS REFERENCE TO OTHER PATENT APPLICATIONS

None.

BACKGROUND OF THE INVENTION

1. Field of the Invention

The present invention relates generally to hydrophones and, more particularly, to a hardware circuit that provides synchronous demultiplexing of a data stream comprising frames of digital words.

2. Description of the Prior Art

Data acquisition cards can be utilized to demultiplex data streams which comprise frames of digital words wherein the frame includes one or more header words, which may be sixteen bit words that are repeated for each frame. However, the data acquisition cards required to demultiplex the data produced by an eight channel hydrophone array tend to be expensive especially in light of additionally required software development. As well, the large software overhead results in significant processing delays and may also occasionally result in errors, lost data, or other problematic operation.

Another approach to demultiplex such data streams may utilize a microprocessor to detect the header words that act to sync each frame of data, and then apply a clock or operate signal to the eight corresponding digital to analog converters. This approach requires non-trivial processing time to respond to the header words.

The following U.S. Patents describe various prior art systems that may be related to the above demultiplexing problems:

U.S. Pat. No. 4,879,694, issued Nov. 7, 1989, to Grado, discloses a demultiplexer circuit responsive to a composite input signal from a sonobouy. The circuit has a filter and comparator means responsive to the composite signal for providing a filtered frequency pilot reference signal. The filtered frequency pilot reference signal has a frequency equal to one half the frequency of a reference carrier signal in the composite signal. The circuit has a sine demodulator means responsive to the composite signal and to an east/west demodulator signal for providing an east referenced output signal. A cosine demodulator means is responsive to the composite signal and to a north/south demodulator signal for providing a demodulated phase pilot signal and the north referenced output signal. A north/south filter means is responsive to the output signals from the cosine demodulator means for filtering the demodulated phase pilot signal to provide the north referenced output signal. A servo means is responsive to the filtered frequency pilot reference signal and to the demodulated phase pilot signal for generating and controlling the phase of the north/south demodulator signal and the east/west demodulator signal using a single phase locked loop. The servo means is characterized to phase shift the north/south and east/west demodulator signals to adjust the outputs of the sine and cosine demodulator means to remove all error bias measured with respect to ground from the demodulated phase pilot signal.

U.S. Pat. No. 5,291,459, issued Mar. 1, 1994, to Andersen, discloses a hydrophone analog signal data acquisition, A/D conversion and data transmission system that includes a first-stage signal processing subsystem which provides digital representations of the hydrophone analog signal, which in turn are signal processed for transmission in the form of data packets by a second stage signal processing subsystem. A subsystem includes a plurality of Data Multiplexer/FIFO units, including corresponding selectively acting data unit accumulators, each accumulator having a plurality of inputs coupled to output channels of the first-stage signal processing subsystem for receiving digital representations of hydrophone analog signals. Each data unit accumulator includes a first buffer for storing information that includes a digital representation of the analog hydrophone signal, an identification of a hydrophone that generated the acoustic information, and a time that the acoustic information is received from the hydrophone. Each data unit accumulator further includes an input interface that is operable during the first period for receiving an alert signal with a hydrophone analog signal, indicating that the associated source has data available. The input interface compares a current state of the alert signal to a previous state for detecting an occurrence of the assertion of the alert signal. The data unit accumulator also receives and stores a unit of data from a data source having an asserted alert signal, and is responsive to the storage of the unit of data therein, during the first period, to receive and store, during the second period, other information associated with the unit of data stored during the first period.

U.S. Pat. No. 5,450,549, issued Sep. 12, 1995, to Casparian, discloses a multi-port buffer that stores digitized image and/or audio information from a video camera and transfers the stored image information to a plurality of output channels. Digitized input data is passed through a crossbar switch and stored in a random access memory (RAM). The image data is retrieved from RAM and passed the crossbar switch to one of a plurality of first-in, first-out (FIFO) registers. Raster scan lines are passed from the FIFO registers to corresponding output channels. The order and rate of writing to RAM and reading out to the FIFO registers is controlled by an asynchronous queuing arbiter. If one of the output channels is slower than the others or operates at a variable clock speed, the asynchronous queuing arbiter changes the order in which the FIFO registers are filled to accommodate that output channel. Should one of the output channels fail, the bus request for the corresponding FIFO register is disabled, thereby skipping the failed channel.

U.S. Pat. No. 5,784,339, issued Jul. 21, 1998, to Woodsum et al, discloses a communication and position determining device for use in an underwater communication and position determining system wherein the device transmits a sequence of one or more data words, wherein each data word includes a plurality of data bits transmitted in parallel as a corresponding number of concurrently transmitted signals, each of which occupies a different frequency band. The signals have waveforms selected from a pair of fade resistant waveforms that can be discriminated from one another, to represent binary data and the frequency bands are separated from one another by guard bands having widths sufficient to prevent intersymbol interference between the signals representing the data bits of a data word due, for example, to doppler and phase/frequency shifting, and successive data words are separated sequentially in time by intervals having a duration sufficient to prevent intersymbol interference between the signals of successive data words due to multipath reverberation. A single one of the signals of a data word is used for position determination wherein two devices each determine the bearing to one another from the bearing of the signals received from the other and a round trip propagation time determined from the time delay in transmitting an interrogation data word, a first response data word and a second response data word.

U.S. Pat. No. 5,844,951, issued Dec. 1, 1998, to Proakis et al, discloses a method and apparatus for multichannel combining and equalization in a multichannel receiver. The receiver jointly performs diversity combining, equalization and synchronization. The method and apparatus may be used to provide a reduced complexity adaptive multichannel receiver for use in a digital communication system.

U.S. Pat. No. 6,289,284, issued Sep. 11, 2001, to Yamamoto, discloses a non-destructive method of measuring physical characteristics of a medium, such as uncemented sediment, sandstone, or limestone. A pseudo-random code is generated and is used to generate a pseudo-random acoustic signal. This signal is transmitted into the medium to be measured through the use of a transducer, such as a piezoelectric element, and is received by a plurality of hydrophones. The received signal is then processed to obtain an image of its velocity and attenuation. A universal geoacoustic model of the medium for a given set of measured data is determined, and the model is solved to obtain a pair of permeability-porosity results for the medium. The one of this pair of permeability-porosity results which is correctly indicative of the physical characteristics of the medium is then determined.

U.S. Pat. No. 7,110,678, issued Sep. 19, 2006, to Willebrand et al, discloses a hybrid wireless optical and radio frequency (RF) communication link that utilizes parallel free-space optical and RF paths for transmitting data and control and status information. The optical link provides the primary path for the data, and the RF link provides a concurrent or backup path for the network data, as well as a reliable and primary path for the control and status information. When atmospheric conditions degrade the optical link to the point at which optical data transmission fails, the hybrid communication link switches to the RF link to maintain availability of data communications. The switch may occur automatically, based on an assessment of the quality of the optical signal communicated through the optical path.

U.S. Pat. No. 7,177,232, issued Feb. 13, 2007, to Hagerty, discloses a wireless hydrophone system that includes a hydrophone joined to a preamplifier. A serial A/D converter receives the amplified hydrophone signal and provides a serial digital output representative of the signal. The A/D converter is joined to a processor which provides a start signal and a clock signal to the A/D converter. A digital transmitter is also controlled by the processor. The transmitter receives the serial digital output from the A/D converter for wireless transmission over an antenna. The system can also include logic for allowing the processor to provide an extended sync signal for transmission. The extended sync signal can alert a receiver to an initial transmission. The system can be incorporated in a hull treatment for positioning on a vessel's hull.

U.S. Pat. No. 7,362,653, issued Apr. 22, 2008, to Green et al, discloses a method and apparatus for determining the geophysical position of an autonomous underwater system utilizing underwater acoustic modems that exchange broadband underwater acoustic signals. The method includes the steps of initiating an exchange of broadband acoustic signals between the autonomous system of unknown geophysical position and a base system of known geophysical position wherein the depths of both systems is known. A bearing calculation is made on one of the signals transmitted between the systems, preferably through the use of an array of hydrophones placed closely together at predetermined locations on either the autonomous or base system. Also, the range between the two systems is determined by measuring the time of travel of at least one signal. By the acoustic transmission and sharing of information, as needed, about the known depths of the systems, the known geophysical position of the base system, and the range between the systems, sufficient data is gathered at one or both systems and used to determine the geophysical position of the autonomous system.

U.S. Pat. No. 7,529,304, issued May 5, 2009, to Hagerty, discloses a data transmission system that includes a serial A/D converter and a transmission processor. Transmission processor provides control signals to the A/D converter and first and second transmitters. The first transmitter is joined to the A/D converter to transmit a sync signal at a first frequency. The second transmitter is joined to transmit serial digitized data at a second frequency. First and second receivers are used to receive these frequencies. A reception processor is joined to the first receiver to activate a D/A converter on receipt of the sync signal. The D/A converter then converts digitized data received by the second receiver back to analog format. A method is also provided for transmitting and decoding the digital data.

U.S. Patent Application Publication No. 2005/0088916, published Apr. 28, 2005, to Zhu et al, discloses a method and a system of a high code speed low error probability underwater acoustic coherent communication for underwater transferring instruction, data and image. The communication system includes a host machine installed on a mother ship or a main control underwater vehicles A and a guest machine installed on an underwater vehicle B, wherein the host machine comprises an electronic subassembly, a transducer and a receiving line array which is vertically deployed and consists of more than two hydrophones, and the guest machine comprises an electronic subassembly and a transmitting/receiving transducer. The signal processing method is based on the joint technology of the space diversity, the self-optimized adaptive decision feedback equalizer and self-optimized adaptive phase tracker so as to overcome the affection of motion of the channel and the vehicles, such that the received signal could be quite close to the transmitted signal, and the bit error probability is low.

The above cited prior art does not disclose a software free system which is operable to quickly synchronize with and demultiplex frames of digital words. The solutions to the above described and/or related problems have been long sought without success. Consequently, those skilled in the art will appreciate the present invention that addresses the above and other problems.

SUMMARY OF THE INVENTION

It is a general purpose of the present invention to provide an improved synchronous demultiplexer circuit.

Another object of the present invention is to avoid the need to provide software for a data acquisition card.

Another object of the present invention is to provide a high speed hardware circuit, which is not slowed by software operation, to demultiplex a data stream.

Accordingly, the present invention provides, in one possible embodiment, a circuit operable for demultiplexing a digital data stream into a plurality of analog signals. The digital data stream may comprise a plurality of data frames with each data frame comprising a plurality of words. Each word comprises at least sixteen bits, although there could be more or fewer bits in a word. At least one word is a header word, which is repeated for each data frame.

The circuit may comprise a data bus to carry the data stream. The data bus may typically comprise at least one data line for each of the at least sixteen bits.

A plurality of digital to analog converters are operably connected to the data bus. Each of the plurality of digital to analog converters may comprise a clock input whereby each of the plurality of digital to analog converters is responsive to a clock signal on the counter output to produce an analog output responsive to a currently present word on the data bus.

A counter element is operably connected to the clock input of each of the plurality of digital to analog converters, whereby as the counter element counts, then the plurality of digital to analog converters are sequentially operated. The counter element may comprise a clock input and is operable to produce the count signal for each of the plurality of digital to analog converters in a known sequence in response to receiving a clock signal on the clock input of the counter element. The counter element may comprise a reset input which resets the known sequence to a known starting point.

A memory element is operably connected to the data bus and detects when the header word appears on the data bus to produce a header detect signal. The header detect signal is used to synchronize operation of the counter with the frame.

Preferably the clock signal applied to the clock control circuit is continuous and the clock control circuit determines when the clock is applied to the counter element, to thereby operate the counter element. The clock control circuit is operably connected to the memory element for receipt of the header detect signal. The clock control circuit may also comprise a clock operate input so that at a desired moment, the circuit is primed or prepared to begin applying the clock signal to the counter element upon receipt of the next header detect signal.

A reset/operate switch is preferably operably connected to the clock operate input, which allows the clock to operate upon receipt of the next header detect signal. In the reset position, the clock is prevented from reaching the counter element and the counter element is reset to a known starting point.

In one possible embodiment, the memory element may comprise a programmable read only memory, which is programmed to produce the header detect signal responsively to the header word being on the data bus.

In one possible embodiment, the reset/operate switch connects to a pull-up debounce circuit. The reset/operate switch may have two basic positions, with one position connecting the pull-up debounce circuit to ground.

In one possible embodiment, the clock control circuit comprises at least a flip-flop circuit and a gate circuit.

In another embodiment, a method for demultiplexing a digital data stream into a plurality of analog signals is provided. The method may comprise steps such as, for example, providing a data bus to carry the data stream, providing that the data bus comprises at least one data line for each of the at least sixteen bits, and operably connecting a plurality of digital to analog converters to the data bus.

Other steps may comprise operably connecting a plurality of counter outputs from a counter element to respective clock inputs of the plurality of digital to analog converters wherein the counter is responsive to a clock signal to sequentially operate each of the plurality of digital to analog converters.

Additional steps may comprise operably connecting a memory element to the data bus, operably connecting a clock control circuit to the counter and to the memory element, and operably connecting a reset/operate switch to the clock control circuit and to the counter.

In one embodiment, the method may comprise programming the memory element to detect the header word and apply a header detect signal to the clock control circuit, whereby when the reset/operate switch produces an operate signal, then a subsequent header word on the data bus results in the clock control circuit beginning to produce the clock signal at the counter. The counter is responsive to the clock signal to sequentially operate the plurality of digital to analog converters to produce the plurality of analog signals.

In one embodiment, when the reset/operate switch produces a reset signal, then the counter element is reset to a known starting point prior to sequentially operating the plurality of digital to analog converters to produce the plurality of analog signals.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings, wherein like reference numerals refer to like parts and wherein.

DETAILED DESCRIPTION OF THE INVENTION

In one possible specific embodiment, the present invention provides a fast digital counting circuit that clocks interlaced 16-bit data words into separate digital-to-analog converters in the correct sequence for each of eight hydrophone channels. The circuit does this after a synchronizing bit pattern is detected by a programmable read-only memory (PROM). A low-cost, commercially available Johnson counter (74HC4017) integrated circuit can be utilized to clock the digital-to-analog converters directly, as described hereinafter. There is no processing software involved, and each digital-to-analog converter produces a hydrophone channel output waveform in real-time.

Figure 1:
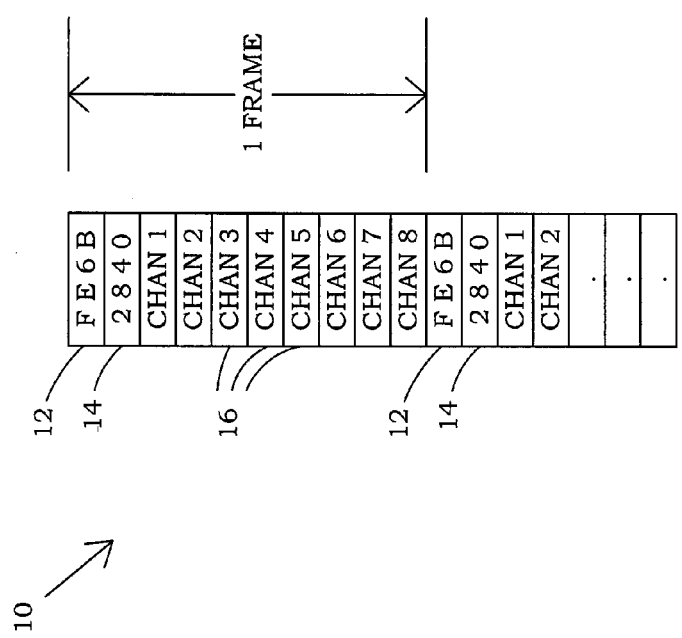
FIG. 1 is block diagram showing the format of a frame of data of a data stream which includes a plurality of data words from a plurality of data channels and two header words in accord with one possible embodiment of the present invention.

Referring now to the drawings and, more particularly, to FIG. 1, there is shown a data frame format for data stream 10. In this embodiment, each frame of data comprises two sixteen bit header words 12 and 14 and eight sixteen bit data words 16, wherein each data word in a frame represents a data sample for a different hydrophone channel.

Figure 2:
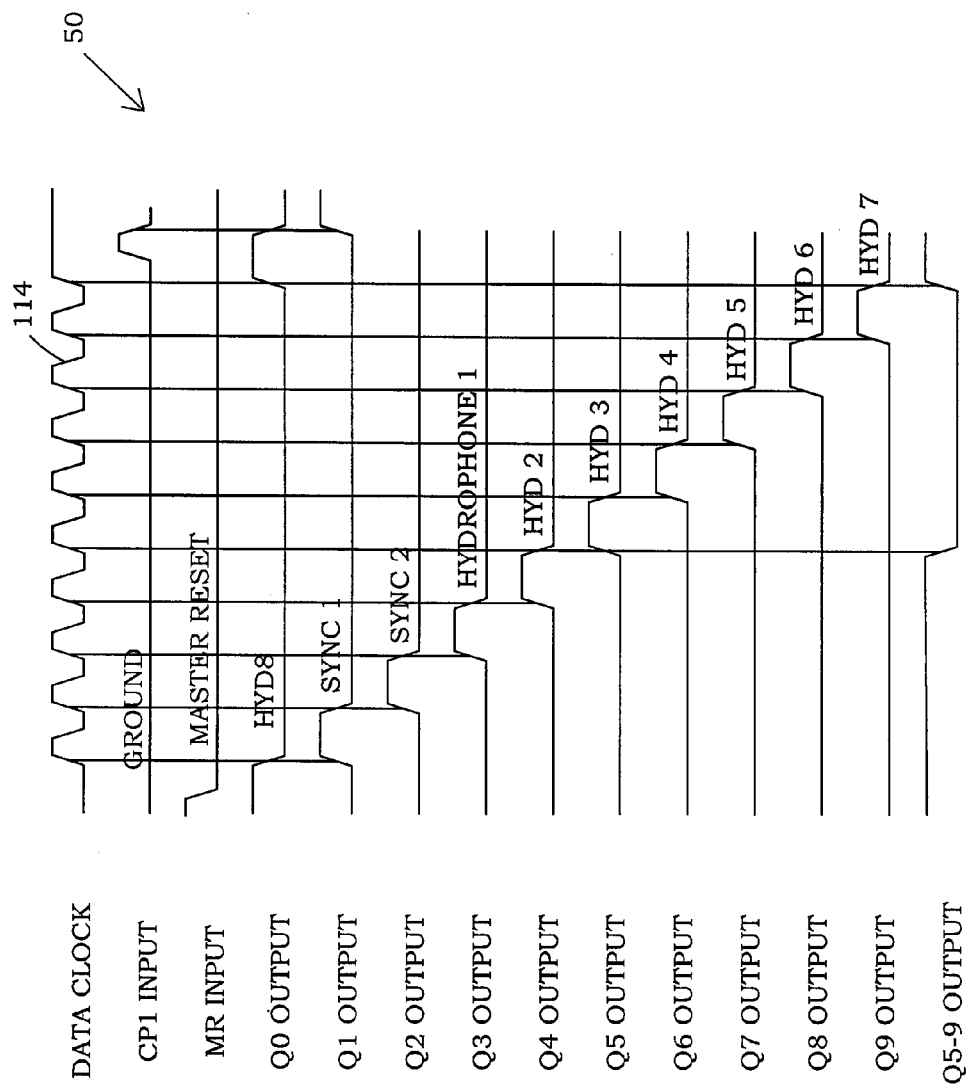
FIG. 2 is a timing diagram showing the output signals of a counter element which is utilized to sequentially operate a plurality of digital to analog converters in accord with one possible embodiment of the present invention.
Figure 3:
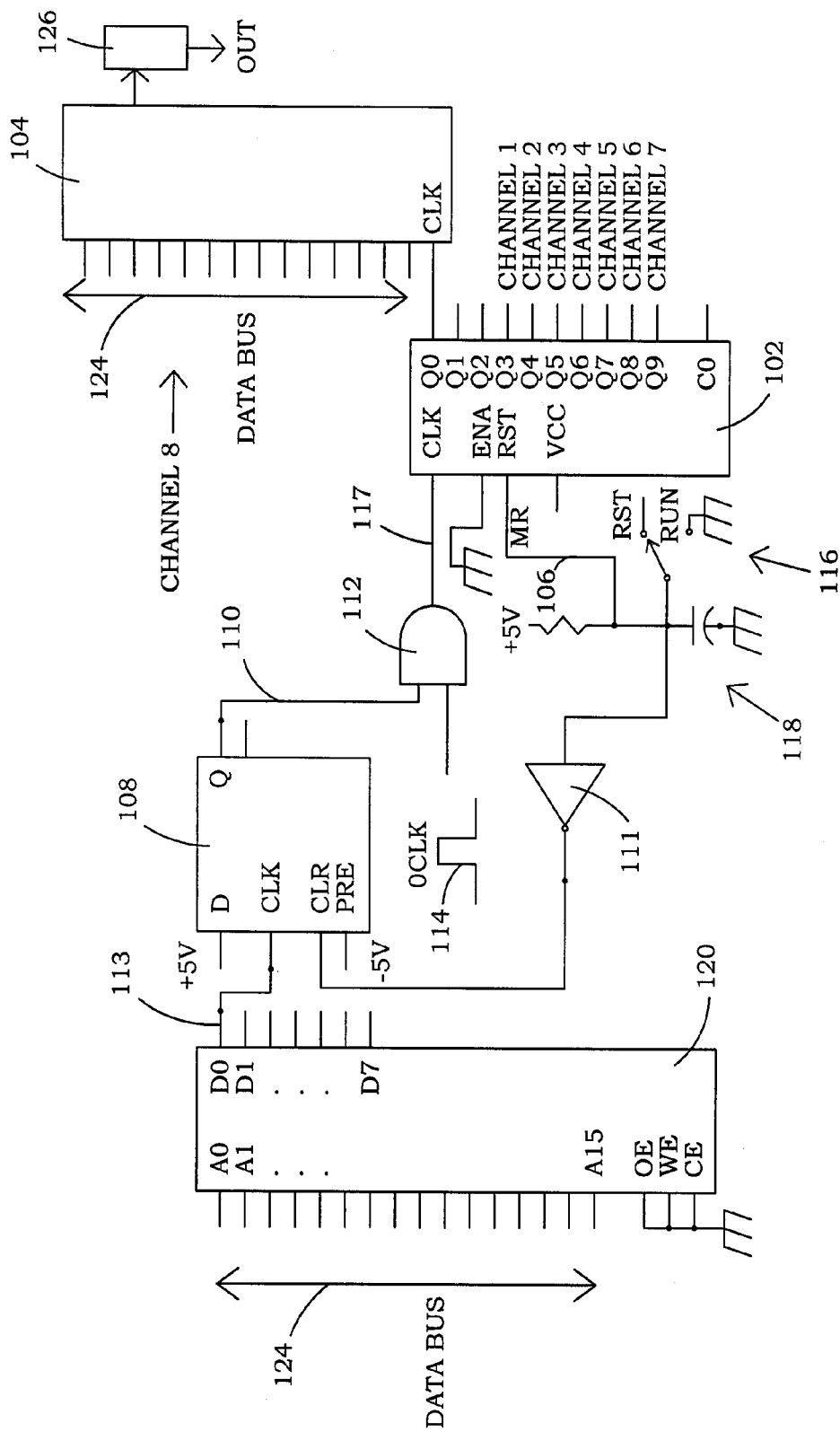
FIG. 3 is a circuit diagram showing a synchronous demultiplexer circuit in accord with one possible embodiment of the present invention.

FIG. 2 shows timing diagram 50 for a presently preferred 74HC4017, as used in one embodiment of the present invention as counter element 102 in synchronous demultiplexer circuit 100, which is shown in FIG. 3. The separate outputs of counter element 102 are connected to eight digital-to-analog converters such as digital-to-analog converter 104, which is utilized for hydrophone channel 8. It will be understood that the remaining channels 1-7 may be configured identically to channel 8 and therefore are not shown in FIG. 3 for clarity and simplifying the drawings.

The 74HC4017 integrated circuit used in this embodiment of the invention as counter element 102 has a typical clock speed of 77 MHz at 5 volts and 25 degrees C. Eight of outputs Q0 to Q9 of counter element 102 are connected to digital-to-analog converters, which represent eight hydrophone channels 1-8, as indicated in FIG. 3. Because counter element 102 has ten states or outputs Q0-Q9, the remaining two states can be assigned to states for the two header words 12 and 14 and left either free running or resynchronized quickly with one header word before the next clocking sequence. In the present embodiment, two of the outputs of counter element 102 are simply left open, and correspond to the two header words, which do not need to be converted to an analog signal.

The present scheme may be expanded for greater than eight hydrophones by cascading counter elements 102 after adding additional extra digital-to-analog converters and use of Q5-Q9 output signal shown in FIG. 2. For instance, additional clock control circuitry may be connected with the Q5-Q9 output signal to alternately apply a clock signal to multiple counter elements 102, if desired.

MR input 106 to counter element 102, shown in FIG. 3, is also labeled Master Reset in the timing diagram of FIG. 2. When MR input 106 is high, output Q0 of counter element 102 is held high, thus resetting counter element 102 to a known starting position. When MR input 106 is high, D flip-flop 108 is also held in the reset state, which for D flip-flop 108 is active low, thereby requiring inverter 111 to invert a high MR input. Thus, in the case of reset/run switch 116 being in the reset position, output 110 of D flip-flop 108 is held low so that AND gate 112 prevents continuous data clock pulses 114 from being applied to clock input 117 of counter element 102 and incrementing counter element 102.

In this embodiment, D flip-flop 108, AND gate 112, and inverter 110, comprise what is referred to herein as a clock control circuit whose function includes either allowing or preventing the otherwise continuous clock pulses 114 from reaching clock input 117 of counter element 102. Various other types of logic elements could be utilized to perform this function.

When reset/run switch 116, is in the reset position shown in FIG. 3, then pull up debounce circuit 118 pulls MR input 106 high, and holds D flip-flop 108 in the reset state, as discussed above. As well, when reset/run switch is in the reset position, counter element 102 is reset to a starting point and clock pulses are not allowed to reach counter element 102. When reset/run switch 116 is grounded in the run position, then counter element 102 can run or operate as clock pulses are received at clock input 117. However, the clock pulses must first be synchronized with the data words in the frames, as discussed below, so that the right data words are converted to analog signals for the right channels.

For synchronization purposes, memory element 120, which may be a programmable read-only memory (PROM), is utilized to detect header words 12 and/or 14. For example, memory element 120 may be programmed to provide a header detect signal at line 113, when header word 12, is detected on the 16 parallel data lines of data bus 124. In this example, FE6B in hexadecimal is the header word, but other header words could also be utilized. If desired, memory element 120 could be programmed to require detection of both header words in a sequence, or a certain number of the bits of each header word, to further reduce the chance that a data word is not mistaken as a header word.

In this embodiment, data bus 124 connects to memory element 120 and to each of the eight digital-to-analog converters, shown in the example of digital-to-analog converter 104, for each of hydrophone channels 1-8.

Data bus 124 carries digital data flow 10 (see FIG. 1), which results in the digital words of each frame being sequentially applied to the data bus with each clock pulse. With synchronization, the correct digital-to-analog converter is activated when the corresponding data word 16 for each channel is on data bus 124.

Thus, in this embodiment of the invention, when FE6B is on data bus 124, then the clock input of D flip-flop 108 goes high. Assume that switch 116 has just been activated by placing the switch in the run or operate position so that D flip-flop 108 is no longer held in the reset state. Therefore, output 110 of D flip-flop 108 goes high when FE6B is detected. AND gate 112 allows the first clock pulse through to counter element 102, clocking the Johnson counter 102 into the Q1 state, e.g., output Q0 goes low and Q1 goes high and the remaining outputs remain low, as shown in FIG. 2. In FIG. 2, this pulse on output Q1 is labeled Sync1 because it coincides with the presence of the FE6B on data bus 124. The second header word on data bus 124 coincides with the next clock pulse, which sets Q2 high. As noted above, these outputs of counter element 102 may be left disconnected and are not decoded. The next clock pulse coincides with a 16-bit hydrophone data word, in this example hydrophone 1 as shown in FIG. 2, which is output Q3 of counter element 102 of FIG. 3.

For the following discussion, it will be assumed that all channels are connected as shown with respect to digital-to-analog converter 104, where output Q0 is connected to the clock input of digital-to-analog converter 104. Output Q3 is then connected to the clock input for Channel 1, output Q4 is connected to the clock input for Channel 2, and so forth. When a clock pulse is received on the clock input of any digital-to-analog converter, then that digital-to-analog converter is activated and produces an analog voltage on the output that corresponds to the data word that is presently on data bus 124.

Accordingly, output Q3 of counter element 102 is connected to the clock input of the digital-to-analog converter for hydrophone channel 1. Therefore the digital-to-analog converter for hydrophone channel 1 is activated at the appropriate time that the data word for hydrophone channel 1 is on data bus 124. In the same way, Q4 clocks the digital-to-analog converter for channel 2, Q5 clocks in channel 3, and so on until counter element 102 clocks utilizes Q9 to clock in or activate the channel 7 digital-to-analog circuit.

Counter element 102 is now freely running or changing one state with each data clock 114, and therefore sequences back to Q0, which clocks digital-to-analog converter 104, which is utilized for channel 8. The two header words follow with the next two clock pulses, and again generate pulses on outputs Q1 and Q2 of counter element 102, as discussed previously.

Thus, in this embodiment, the sequence is repeated every ten pulses. Except for the very short low-nanosecond delays of demultiplexer circuit 100, the decoded hydrophone data appear at the outputs of the digital-to-analog converters in real time, e.g., at effectively the same time the corresponding data words appear on data bus 124.

Smoothing filters, such as smoothing filter 126 may be utilized at the outputs of the digital-to-analog converter outputs to smooth the sampling noise. Other types of filtering, e.g., sin(x)/x distortion correction can applied here, if desired.

In this embodiment, memory element 120 and all digital-to-analog converter elements are all connected together at the inputs to the 16 hydrophone data bus lines of data bus 124. However, only one digital-to-analog converter is clocked at any one time depending on the output state of counter element 102.

Synchronous demultiplexer circuit 100 can be re-synchronized by opening reset/run switch 116, forcing counter element 102 and D flip-flop 108 to reset. Closing reset/run switch 116 will enable counting operation of counter element 102 once again after header word FE6B (or any other desired header word) is detected by memory element 120, as discussed hereinbefore.

Because the use of a header word assumes perfect detection of all sixteen bits, a high signal-to-noise ratio is assumed with this circuit. However, if this is not the case, then memory element 120 can be programmed to produce an output if there are one or two header bits in error. Selecting the number of allowed errors depends on the environment.

Synchronous multiplexer circuit 100 has a cost of only a few dollars minus the cost of digital-to-analog converters, which are always necessary. For hydrophone systems, relatively low speed digital-to-analog converters may be utilized. There is no need for software overhead and the circuit can be resynchronized at any time. Counter element 102, preferably a Johnson counter, can be cascaded for hydrophone arrays greater in size than eight channels. For many applications, there are no separate, asynchronous free-running clock oscillators required except for the external data clock pulse 114, which lowers the overall system noise.

Preferably the present invention utilizes parallel input digital-to-analog converters as shown in FIG. 3. Serial input converters, while possible, would require a clocking circuit with a parallel in, serial out clocked shift register to clock in the sixteen data bits. This must be done within each sampling interval for each converter. Therefore, in a preferred embodiment, selection of digital-to-analog converter may begin with the parallel-load feature.

The digital-to-analog converters should have a format that is compatible with the format of the data words from the analog-to-digital converters in the hydrophone electronics, e.g., two-s compliment, straight binary, and the like. In some cases, the digital-to-analog converter will allow multiple data format options by setting pins high or low. If necessary, the sixteen bit words can be converted to the proper format, such as by a low pin-count microprocessor, or the like, and sent to the data bus or digital-to-analog converter at the proper time.

While specific components have been described herein as a presently preferred embodiment, variations in those components may be utilized. Memory element 120 may be any programmable device used to perform the desired function. Reset/run switch 118 may be a manual switch, semi-conductor switch, or the like. The data bus may be increased or decreased in size. Many other types of flip-flops, logic gates, and the like may be utilized for the clock control circuitry to perform the same function.

While synchronous multiplexer circuit 100 has been described for use with hydrophone systems, the circuitry may be used in other applications.

Many additional changes in the details, components, steps, and organization of the system, herein described and illustrated to explain the nature of the invention, may be made by those skilled in the art within the principle and scope of the invention. It is therefore understood that within the scope of the appended claims, the invention may be practiced otherwise than as specifically described.

What is claimed is:

1. A circuit operable for demultiplexing a digital data stream into a plurality of analog signals, said digital data stream comprising a plurality of data frames with each data frame comprising a plurality of words wherein each word comprises at least sixteen bits, at least one word comprising a header word, which is repeated for each data frame, said circuit comprising:
   a data bus to carry said data stream comprising at least one data line for each of said at least sixteen bits;
   a plurality of digital to analog converters operably connected to said data bus, each of said plurality of digital to analog converters comprising a counter input whereby each of said plurality of digital to analog converters is responsive to a count signal on said counter input to produce an analog output responsive to a currently present word on said data bus;
   a counter element being operably connected to said counter input of each of said plurality of digital to analog converters, said counter element comprising a clock input and being operable to produce said count signal for each of said plurality of digital to analog converters in a known sequence in response to receiving a clock signal on said clock input, said counter element comprising a reset input which resets said known sequence to a known starting point;
   a memory element operably connected to said data bus, said memory element being responsive to said header word on said data bus to produce a header detect signal;
   a clock control circuit operably connected to said memory element for receipt of said header detect signal, said clock control circuit comprising a clock operate input to receive a clock operate signal, whereby said clock control is operable to produce said clock signal for said clock input of said counter element responsively to said header detect signal and said operate signal; and
   a reset/operate switch being operably connected to said clock operate input and to said reset input of said counter element.

2. The circuit of claim 1, wherein said counter element has a separate output which connects to each of said plurality of digital-to-analog converters.

3. The circuit of claim 1, wherein said counter element comprises at least one additional output which corresponds to said header word.

4. The circuit of claim 1, wherein said reset/operate switch is operable in a reset position to apply a reset signal to said reset input, and to remove said clock operate signal from said clock control circuit to prevent said clock signal from being applied to said clock input of said counter element.

5. The circuit of claim 1, wherein said clock control circuit comprises at least a flip-flop circuit and a gate circuit, whereby the clock control circuit is configured to prevent or allow an otherwise continuous clock signal reaching said counter element.

6. The circuit of claim 1, wherein said memory element comprises a programmable read only memory, which is programmed to produce said header detect signal responsively to said header word being on said data bus.

7. The circuit of claim 1, wherein said counter element comprises at least one integrated circuit, which is capable of operation at over fifty megahertz.

8. A method for demultiplexing a digital data stream into a plurality of analog signals, said digital data stream comprising a plurality of data frames with each data frame comprising a plurality of words wherein each word comprises at least sixteen bits, at least one word for each data frame comprising a header word, said header word being repeated for each data frame, said method comprising:
   providing a data bus to carry said data stream;

providing that said data bus comprises at least one data line for each of said at least sixteen bits;

operably connecting a plurality of digital to analog converters to said data bus;

operably connecting a plurality of different counter outputs from a counter element to respective ones of said plurality of digital to analog converters, said counter element being responsive to a clock signal to sequentially operate each of said plurality of digital to analog converters;

operably connecting a memory element to said data bus;

operably connecting a clock control circuit to said counter element and to said memory element;

operably connecting a reset/operate switch to said clock control circuit and to said counter element;

programming said memory element to detect said header word and apply a header detect signal to said clock control circuit; and whereby when said reset/operate switch produces an operate signal, then a subsequent header word on said data bus results in said clock control circuit beginning to produce said clock signal at said counter element, whereupon said counter element is responsive to said clock signal to sequentially operate said plurality of digital to analog converters to produce said plurality of analog signals.

9. The method of claim 8, comprising utilizing an integrated circuit for said counter element which comprises said plurality of different counter outputs, and providing that said counter element comprises at least one additional output which corresponds to said header word.

10. The method of claim 8, wherein when said reset/operate switch produces a reset signal, then said counter element is reset to a known starting point prior to sequentially operating said plurality of digital to analog converters to produce said plurality of analog signals.

11. The method of claim 8, further comprising connecting said reset/operate switch to a pull-up debounce circuit.

12. The method of claim 8, further comprising providing at least one gate circuit for said clock control circuit.

13. The method of claim 8, further providing that said memory element is a programmable read only memory and programming said programmable read only memory to produce said header detect signal responsively to said header word being on said data bus.

* * * * *